(12) United States Patent
Lai et al.

(10) Patent No.: US 7,375,964 B2
(45) Date of Patent: May 20, 2008

(54) MEMORY MODULE ASSEMBLY INCLUDING A CLAMP FOR MOUNTING HEAT SINKS THEREON

(75) Inventors: Cheng-Tien Lai, Tu-Cheng (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 93 days.

(21) Appl. No.: 11/309,226

(22) Filed: Jul. 13, 2006

(65) Prior Publication Data

US 2007/0223198 A1  Sep. 27, 2007

(30) Foreign Application Priority Data

Mar. 25, 2006  (CN) ..................... 2006 1 0034747

(51) Int. Cl.
*H05K 7/20* (2006.01)
(52) U.S. Cl. ................ 361/704; 361/715; 361/719; 257/707; 257/719
(58) Field of Classification Search ............... 361/600, 361/704, 710, 715, 719; 257/707, 719, E23.086
See application file for complete search history.

(56) References Cited

U.S. PATENT DOCUMENTS

| | | | | |
|---|---|---|---|---|
| 5,966,287 A | * | 10/1999 | Lofland et al. | 361/704 |
| 7,221,569 B2 | * | 5/2007 | Tsai | 361/704 |
| 2003/0026076 A1 | * | 2/2003 | Wei | 361/704 |
| 2007/0165382 A1 | * | 7/2007 | Yu et al. | 361/704 |
| 2007/0195489 A1 | * | 8/2007 | Lai et al. | 361/600 |
| 2007/0263359 A1 | * | 11/2007 | Lai et al. | 361/715 |
| 2007/0263360 A1 | * | 11/2007 | Lai et al. | 361/719 |
| 2007/0263361 A1 | * | 11/2007 | Lai et al. | 361/719 |

* cited by examiner

*Primary Examiner*—Jayprakash Gandhi
*Assistant Examiner*—Courtney L Smith
(74) *Attorney, Agent, or Firm*—Jeffrey T. Knapp

(57) ABSTRACT

A memory module assembly includes a pair of heat-dissipation plates (10), a printed circuit board (20) sandwiched between the heat-dissipation plates (10), and four clamps (30) for securing the heat-dissipation plates (10) onto opposite sides of the printed circuit board (20). Each clamp includes a connecting portion (32) and a pair of elastic pressing portions (34) extending from opposite free ends of the connecting portion. Each pressing portion has a pair of hooks (342) extending from opposite lateral sides thereof and an engaging portion extending (344) from a free end thereof and clamping on an end of the heat-dissipation plate. The hooks are inserted into openings (18) defined in the heat-dissipation plates and engage with inner surfaces of the heat-dissipation plates.

15 Claims, 4 Drawing Sheets

MEMORY MODULE ASSEMBLY INCLUDING A CLAMP FOR MOUNTING HEAT SINKS THEREON

FIELD OF THE INVENTION

The present invention relates generally to memory module assemblies, and more particularly to a memory module assembly including a plurality of clamps for mounting a pair of heat-dissipation plates on opposite surfaces of a printed circuit board of the memory module assembly.

DESCRIPTION OF RELATED ART

The memory module assemblies that are currently in the use generally do not require cooling devices to dissipate heat as they are operated on or below 66 MHz and do not generate enough heat to require a cooling device. However, as the industry progresses, memory module assemblies, such SDRAM DIMM memory module assemblies may be required to operate at 100 MHz or above. For these state-of-the-art memory module assemblies, heat sinks will be required to remove heat generated thereby. However, since the memory module assemblies have small board areas and are usually mounted on an already crowded motherboard of a computer, the mounting of such a heat sink on the memory module assembly becomes an issue.

SUMMARY OF THE INVENTION

A memory module assembly in accordance with a preferred embodiment comprises a pair of heat-dissipation plates, a printed circuit board sandwiched between the heat-dissipation plates, and four clamps for securing the heat-dissipation plates onto opposite sides of the printed circuit board. Each clamp includes a connecting portion and a pair of elastic pressing portions extending from opposite free ends of the connecting portion. Each pressing portion has a pair of hooks extending from opposite lateral sides thereof and an engaging portion inwardly extending from a free end thereof and attached on an inner face of an end of the heat-dissipation plate.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
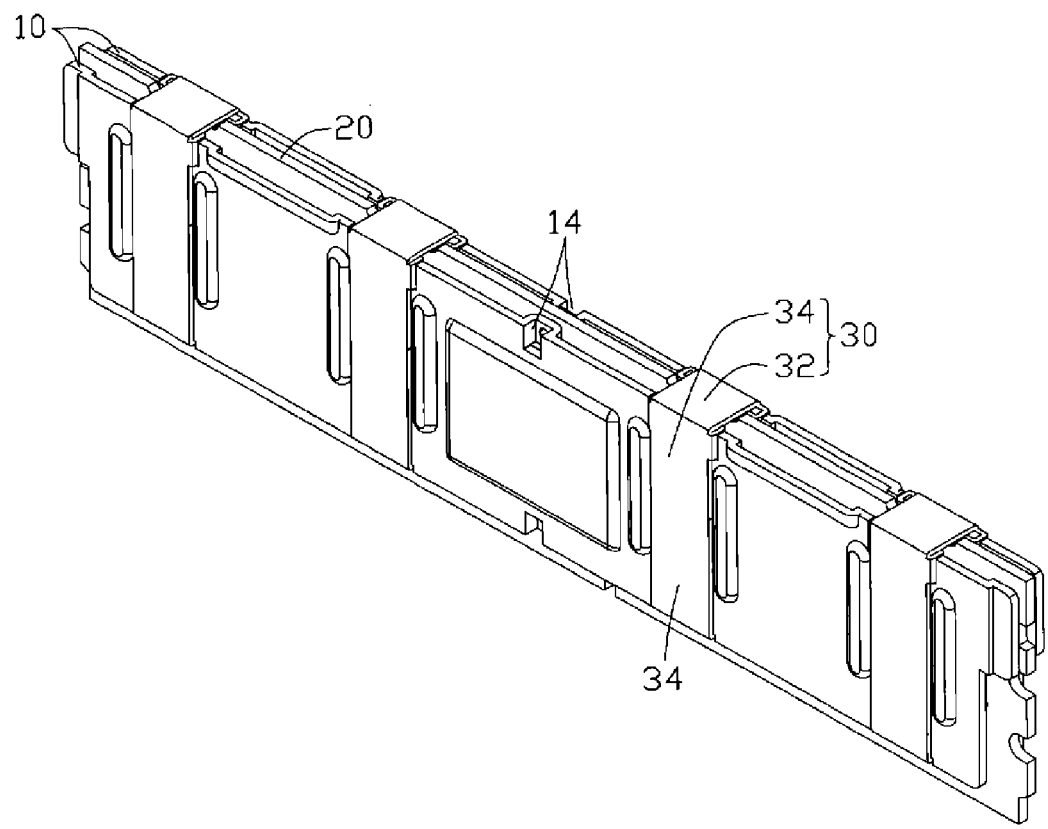
FIG. 1 is an assembled view of a memory module assembly in accordance with a preferred embodiment of the present invention.
Figure 2:
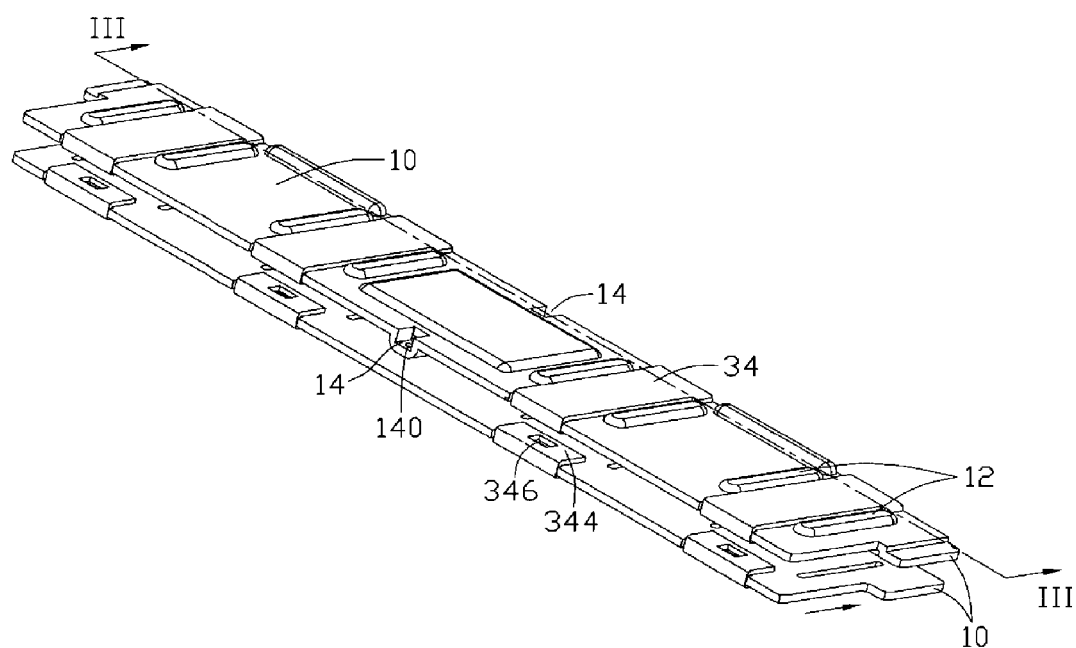
FIG. 2 is a partly assembled view of FIG. 1.
Figure 3:
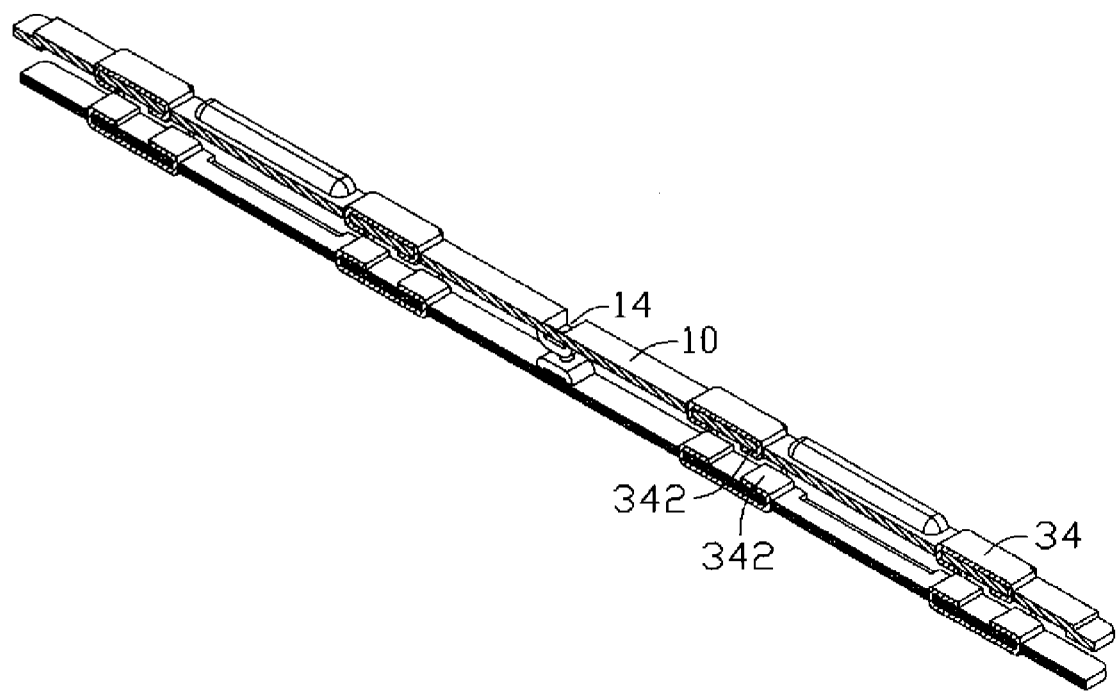
FIG. 3 is a cross-sectional view taken along line 111-111 in FIG. 2.

FIGS. 1-2 show a memory module assembly in accordance with a preferred embodiment of the present invention. The memory module assembly comprises a pair of heat-dissipation plates 10, a printed circuit board 20 sandwiched between the heat-dissipation plates 10, and four clamps 30 for securing the heat-dissipation plates 10 onto opposite sides of the printed circuit board 20. The printed circuit board 20 has a rectangular shape having first and second faces and two long sides and two short sides between the long sides.

Figure 4:
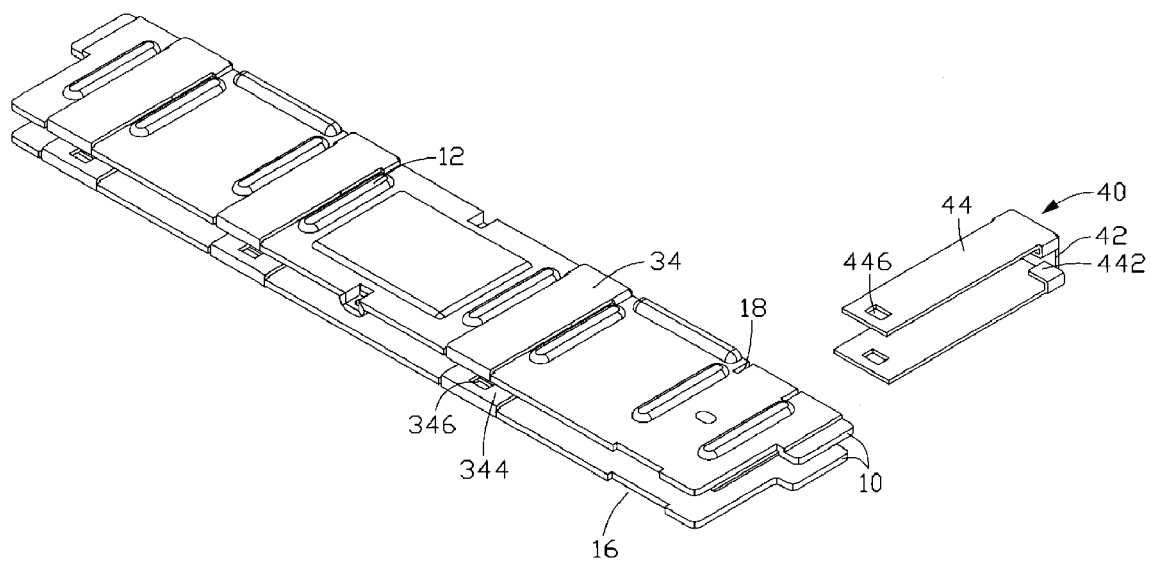
FIG. 4 is a preassembled view of FIG. 2.

Referring to FIGS. 1-4, each heat-dissipation plate 10 comprises a rectangular shape and two long sides and two short sides between the long sides. Four pairs of ribs 12 are formed extending in a direction along the short sides of the heat-dissipation plate 10. Each pair of ribs 12 is positioned with space between them on a front surface of the heat-dissipation plate 10 to form a receiving region (not labeled), for facilitating an engagement with the corresponding clamp 30. A pair of depressed portions 14 are respectively located in upper and lower ends of the front surface of the heat-dissipation plate 10 and a through hole 140 is defined in each depressed portion 14 for a fastener, for example a rivet (not labeled), to extend through to connect the heat-dissipation plates 10 and the printed circuit board 20 together. Referring to FIG. 4, a groove 16 is defined in the front end of the heat-dissipation plate 10 and a pair of latching portions, such as a pair of openings 18, are defined in a rear end of the heat-dissipation plate 10 and corresponding to the groove 16. The openings 18 extend in parallel with the short sides of the heat-dissipation plate 10.

Each clamp 30 has a n-shaped configuration and comprises a connecting portion 32 and a pair of elastic pressing portions 34 extending from two opposite free ends of the connecting portion 32. Each pressing portion 34 has a pair of hooks 342 extending from opposite lateral sides thereof and an engaging portion 344 extending from a free end thereof. The hooks 342 are inserted in the opening 18 of the heat-dissipation plate 10 to be attached to an inner surface of the rear end of the heat-dissipation plate 10. The engaging portions 344 are accepted in the grooves 16 and inwardly curved to attach to an inner surface of a front end of the heat-dissipation plate 10. Each engaging portion 344 defines a recess 346 at a middle thereof, for facilitating an engagement with a tool which is used to open the front ends of the heat-dissipation plates 10 outwardly.

In assembly, before the clamps 30 are clamped on the heat-dissipation plates 10, each clamp 30 is shaped like a clamp 40 of FIG. 4. The clamp 40 has a connecting portion 42 and a pair of elastic pressing portions 44 extending from two free ends of the connecting portion 42. A pair of hooks 442 extend from opposing lateral sides of each pressing portion 44. A recess 446 is defined in a free end of each of the pressing portions 44. When the pressing portions 44 of the clamp 40 are attached on the outer sides of the heat-dissipation plates 10, the hooks 442 are inserted into the openings 18 and attached on the inner surfaces of the heat-dissipation plates 10. The free ends of the pressing portions 44 of the clamp 40 are shaped so as to be accepted in the grooves 16 to form the engaging portions 344 of the clamps 30. The engaging portions 344 are tightly attached onto the inner surfaces of the front ends of the heat-dissipation plates 10 and the pressing portions 34 are received in their respective receiving regions formed by the ribs 12.

In operation, the tool is used to act on the recesses 346 of the clamps 30 to open the front ends of the heat-dissipation plates 10 outwardly to form a large enough space for the printed circuit board 20 to be inserted between the heat-dissipation plates 10 along a direction as indicated by an arrow of FIG. 2. When the printed circuit board 20 is sandwiched between the two heat-dissipation plates 10, the tool is removed and the clamps 30 firmly clamp the heat-dissipation plates 10 on opposite surfaces of the printed circuit board 20. Thus, heat-generating chips (not shown) on the printed circuit board 20 can have an intimate contact with the two heat-dissipation plates 10. Accordingly, heat generated by the chips can be absorbed and dissipated by the heat-dissipation plates 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
   a printed circuit board having a rectangular shape;
   a pair of heat-dissipation plates attached on opposite sides of the printed circuit board, each heat-dissipation plate having a rectangular shape;
   a plurality of substantially n-shaped clamps for securing the heat-dissipation plates onto the opposite sides of the printed circuit board, each clamp comprising a connecting portion and a pair of elastic pressing portions extending from opposite free ends of the connecting portion, each pressing portion having a pair of hooks extending from opposite lateral sides thereof and an engaging portion extending from a free end thereof and clamping on an end of the heat-dissipation plate;
   wherein the hooks of the pressing portions of the clamps are inserted into the heat-dissipation plates and tightly attached on inner surfaces of the heat-dissipation plates and the engaging portions of the pressing portions are curved to pass around bottom ends of the heat-dissipation plates and attached on the inner surfaces of the heat-dissipation plates.

2. The memory module assembly as claimed in claim 1, wherein each heat-dissipation plate forms a plurality of ribs extending in a direction along short sides of the heat-dissipation plate to form receiving regions for receiving the pressing portions of the clamps.

3. The memory module assembly as claimed in claim 2, wherein each heat-dissipation plate defines a pair of depressed portions located in opposite ends of the heat-dissipation plate and each depressed portion defines a through hole therein for a fastener to extend through to connect the heat-dissipation plates and the printed circuit board together.

4. The memory module assembly as claimed in claim 1, wherein each heat-dissipation plate defines a groove in the bottom end of the heat-dissipation plate to accept the engaging portion of the pressing portion of the clamp therein.

5. The memory module assembly as claimed in claim 4, wherein each heat-dissipation plate defines a pair of openings in an upper end of the heat-dissipation plate and corresponding to the groove, the hooks being inserted into the openings to clip on the heat-dissipation plate.

6. The memory module assembly as claimed in claim 5, wherein each opening extends in parallel to short sides of the heat-dissipation plate.

7. The memory module assembly as claimed in claim 5, wherein the hooks of the pressing portion curve inwardly.

8. The memory module assembly as claimed in claim 5, wherein each engaging portion defines a recess therein.

9. A memory module assembly comprising:
   a printed circuit board having at least a heat-generating chip thereon;
   a pair of heat-dissipation plates mounted on opposite faces of the printed circuit board with one of the heat-dissipation plates being thermally connected with the at least a heat-generating chip so that heat generated by the at least a heat-generating chip is absorbed and dissipated by the one of the heat dissipation plates; and
   a plurality of n-shaped clamps "comprising a connecting portion and a pair of pressing pieces extending from opposite free ends of the connecting portion" clamping the heat-dissipation plates toward the printed circuit board, wherein each of the clamps has at least a hook at an upper end thereof extending into at least an opening defined in an upper end of at least one of the heat-dissipation plates and engaging with an inner face of the at least one of the heat-dissipation plates and an engaging portion at a lower end thereof engaging with "and curved to pass around" a bottom end of the at least one of the heat-dissipation plates "and attached on the inner surfaces of the heat dissipation plates".

10. The memory module assembly as claimed in claim 9, wherein each of the clamps has two hooks at the upper end thereof, the two hooks extending into two openings defined in the upper end of the at least one of the heat-dissipation plates and engaging with the inner face of the at least one of the heat-dissipation plates.

11. The memory module assembly as claimed in claim 10, wherein the engaging portion defines a recess therein, adapted for receiving a tool.

12. The memory module assembly as claimed in claim 11, wherein each of the heat-dissipation plates forms a plurality of pairs of ribs thereon, and the clamps are located between the pairs of ribs, respectively.

13. The memory module assembly as claimed in claim 9, wherein the engaging portion engages in a groove defined in the bottom end of the at least one of the heat-dissipation plates.

14. The memory module assembly as claimed in claim 12, wherein the engaging portion engages in a groove defined in the bottom end of the at least one of the heat-dissipation plates.

15. The memory module assembly as claimed in claim 9, wherein each of the heat-dissipation plates forms a plurality of pairs of ribs thereon, and the clamps are located between the pairs of ribs, respectively.

* * * * *